(12) United States Patent
Naffziger

(10) Patent No.: US 7,772,889 B2
(45) Date of Patent: Aug. 10, 2010

(54) PROGRAMMABLE SAMPLE CLOCK FOR EMPIRICAL SETUP TIME SELECTION

(75) Inventor: Samuel D. Naffziger, Fort Collins, CO (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 14 days.

(21) Appl. No.: 12/100,052

(22) Filed: Apr. 9, 2008

(65) Prior Publication Data

US 2009/0256593 A1 Oct. 15, 2009

(51) Int. Cl.
*H03K 19/00* (2006.01)
*H03K 3/289* (2006.01)
*G06F 7/38* (2006.01)

(52) U.S. Cl. .............................. 326/93; 326/40; 327/202
(58) Field of Classification Search .................. None
See application file for complete search history.

(56) References Cited

U.S. PATENT DOCUMENTS

| | | | | |
|---|---|---|---|---|
| 5,259,006 A | * | 11/1993 | Price et al. ................... | 375/356 |
| 5,712,826 A | | 1/1998 | Wong et al. | |
| 5,764,089 A | | 6/1998 | Partovi et al. | |
| 5,867,453 A | | 2/1999 | Wang | |
| 5,917,355 A | | 6/1999 | Klass | |
| 5,920,575 A | * | 7/1999 | Gregor et al. ................ | 714/726 |
| 5,999,030 A | * | 12/1999 | Inoue .......................... | 327/202 |
| 6,167,001 A | | 12/2000 | Wu | |
| 6,278,308 B1 | | 8/2001 | Partovi et al. | |
| 6,486,723 B1 | | 11/2002 | DeRyckere | |
| 6,597,620 B1 | | 7/2003 | McMinn | |
| 6,611,435 B2 | | 8/2003 | Kumar | |
| 6,930,522 B2 | * | 8/2005 | Chang ......................... | 327/154 |
| 7,301,373 B1 | | 11/2007 | Bailey et al. | |
| 7,408,393 B1 | * | 8/2008 | Jain et al. .................... | 327/202 |

(Continued)

OTHER PUBLICATIONS

Fischer, et al; "A 90nm Variable-Frequency Clock System for a Power-Managed Itanium® -Family Processor"; Solid-State Circuits Conference, 2005. Digest of Technical Papers. ISSCC. 2005 IEEE International, Publication Date: Oct. 10 Feb. 2005, pp. 294-295 & 599. vol. 1, San Francisco, CA, ISSN: 0193-6530, ISBN: 0-7803-8904-2.

(Continued)

*Primary Examiner*—Rexford N Barnie
*Assistant Examiner*—Dylan White
(74) *Attorney, Agent, or Firm*—Rory D. Rankin; Meyertons Hood Kivlin Kowert & Goetzel, P.C.

(57) ABSTRACT

A system and method for efficient improvement of timing analysis for faster processor designs with negligible impact on die-area. Rather than provide a single clock to flip-flop circuits on a semiconductor chip, split clocks are used. A flip-flop receives a master clock signal for a master latch and receives a separate slave clock signal for a slave latch. Master and slave clock gater circuits are coupled to a global clock distribution system and the local flip-flops. The master clock gater circuit receives a delay control signal used to select a delay, wherein the selected delay determines an additional amount of time the master clock signal transitions after the slave clock signal transitions. The use of the delayed master clock on the semiconductor chip may allow a timing path to have more computation time without increasing the clock cycle time. Further, the delay may be chosen to fix timing paths in post-silicon.

14 Claims, 12 Drawing Sheets

U.S. PATENT DOCUMENTS

| | | | |
|---|---|---|---|
| 7,409,568 | B2 | 8/2008 | Tam |
| 7,454,637 | B2 | 11/2008 | Er |
| 7,472,365 | B1 | 12/2008 | Manaker |
| 2004/0075478 | A1* | 4/2004 | Correale et al. ............. 327/202 |
| 2005/0005214 | A1* | 1/2005 | Ueda ........................ 714/726 |
| 2007/0001732 | A1* | 1/2007 | Branch et al. .............. 327/218 |
| 2007/0300108 | A1* | 12/2007 | Saint-Laurent et al. ...... 714/726 |
| 2008/0238476 | A1* | 10/2008 | Lewis et al. .................. 326/40 |
| 2009/0058486 | A1* | 3/2009 | Ozawa et al. .............. 327/203 |

OTHER PUBLICATIONS

Karnik, et al "Scaling trends of Cosmic Rays induced Soft Errors in static latches beyond 0.18 pts" 2001 Symposium on VLSI Circuits of Technical Papers, pp. 61-62.

Goel. et al "Low-Overhead Design of Soft-Error-Tolerant Scan Flip-Flops with Enhanced-Scan Capability" 2006 Asia and South Pacific Conference on Design Automation, Jan. 24-27, 2006 pp. 665-670.

Krishnamohan, et al "A Highly-Efficient Techniques for Reducing Soft Errors in Static CMOS Circuits" pp. 126-131, 2004 IEEE International Conference on Computer Design (ICCD'04), 2004.

* cited by examiner

100 US 7,772,889 B2

PROGRAMMABLE SAMPLE CLOCK FOR EMPIRICAL SETUP TIME SELECTION

BACKGROUND OF THE INVENTION

1. Field of the Invention

This invention relates to electronic circuits, and more particularly, to setup time selection for a sequential element.

2. Description of the Relevant Art

Performance of electronic circuits is dependent on the operating frequency of the clock. The duration of a clock cycle period is determined by the amount of time required by combinatorial logic between sequential elements, such as latches and flip-flops, to perform a computation or operation. Also, the clock cycle period is lengthened by the overhead of sequential elements and clock uncertainties. The overhead of sequential elements includes the setup time and the propagation delay clock-to-output (C2Q). Clock uncertainties include clock skew, which is the difference in time a clock signal takes to reach two different sequential elements, and clock jitter, which is the variation of a clock waveform edge from an expected predetermined threshold. Therefore, setup time, C2Q, skew, and jitter lengthen the clock cycle period, which reduces the operational frequency and performance of the electronic circuit as shown below in the following equation.

$$1/f_{operational} = T_{Cycle} = T_{Logic} - T_{C2Q} - T_{Setup} - T_{Skew} - T_{Jitter}$$

Prior methods to reduce skew and jitter in a clock system have used a fixed setup and hold time for sequential elements and then use a grid system for clock distribution, a skew-matched RLC tree network for clock distribution, wherein RLC stands for the parasitics on an electronic circuit such as Resistance (R), Inductance (L), and Capacitance (C), or use other clock distribution techniques.

However, even if the clock skew and jitter are reduced to a negligible amount, the setup time and C2Q delay still limit the operational frequency as indicated below.

$$1/f_{operational} = T_{Cycle} = T_{Logic} - T_{C2Q} - T_{Setup}$$

Further, the analysis of the clock distribution system and the measured reduction of clock skew and jitter are performed pre-silicon, or before the actual die is fabricated and returned for testing. Approximations of the effects of the fabrication process are included in software models of both transistors and routed lines of an electronic circuit. These approximations, which only estimate actual post-silicon conditions, are used in pre-silicon circuit simulations to characterize the expected behavior of the circuits. Variations in the models from real behavior and variations in operating temperature and voltage in the post-silicon circuit may cause the skew value to no longer be negligible. This skew value will decrease the clock cycle period once again, which accordingly, reduces the operational frequency and performance of the circuit.

One method used to compensate for these variations includes providing a programmable delayed clock to a flip-flop in post-silicon. The same clock signal is routed to both the master latch and the slave latch of the flip-flop. Such a scheme can decrease the setup time for a first path between two sequential elements, which allows the clock cycle period to decrease, and accordingly, allows the operational frequency to increase. The setup time of the first timing path is permitted to decrease, since the master latch of the flip-flop receives the delayed clock signal. However, the slave latch of the same flip-flop receives the same delayed clock signal, and thus, the C2Q delay of a second timing path, immediately subsequent to the first timing path, has increased.

Timing analysis may be performed post-silicon with the above approach. If the second timing path can accommodate the increased C2Q delay, then the first timing path can take advantage of the reduced setup time and the operational frequency is permitted to increase. However, the increased C2Q delay in the second timing path both reduces the value $T_{Logic}$ reduces the opportunities to utilize the delayed clock in post-silicon in order to optimize timing paths and increase performance.

In view of the above, efficient methods and mechanisms for supplying a delayed clock to a flip-flop post-silicon are desired.

SUMMARY OF THE INVENTION

Systems and methods for efficient improvement of timing analysis are disclosed.

In one embodiment, a clock distribution system within a semiconductor chip may comprise flip-flop circuits with split clocks such as a master latch clock input and a separate slave latch clock input. A master clock gating circuit may be used to generate a master clock signal different from a slave clock signal. In one embodiment, the master clock gating circuit receives an earlier stage clock signal, which may be a common clock signal from a global clock distribution system. In an alternative embodiment, the earlier stage clock signal is the slave clock signal itself. The master clock gating circuit also receives a delay control signal used to determine an additional amount of time the master clock signal transitions after the slave clock signal transitions.

In another aspect of the invention, a method is provided to distribute split clocks across a semiconductor chip. A master clock signal is generated that is different from a slave clock signal. A delay is selected, wherein the delay determines an additional amount of time the master clock signal transitions after the slave clock signal transitions. Flip-flop circuits receive the master clock signal on a master latch clock input and receive the slave clock signal on a slave latch clock input. This clock distribution may allow a timing path to have more computation time without increasing the clock cycle time.

In still another aspect of the invention, a semiconductor chip includes a master clock gating circuit coupled to a global clock distribution system and local flip-flop circuits. An earlier stage clock signal is received by the master clock gating circuit. In one embodiment, the earlier stage clock signal is a common clock signal from a global clock distribution system. In an alternative embodiment, the earlier stage clock signal is a slave clock signal. The master clock gating circuit comprises circuitry configured to generate a master clock signal, which is different from a slave clock signal, from the earlier stage clock signal.

The circuitry receives a delay control signal used to select a delay, wherein the delay determines an additional amount of time the master clock signal transitions after the slave clock signal transitions. The master clock gating circuit conveys the master clock signal to a master latch clock input of a flip-flop circuit, wherein the master clock signal is not conveyed to a slave latch clock input of the flip-flop circuit. The use of the master clock gating circuit on the semiconductor chip may allow a timing path on the semiconductor chip to have more computation time without increasing the clock cycle time.

Figure 1:
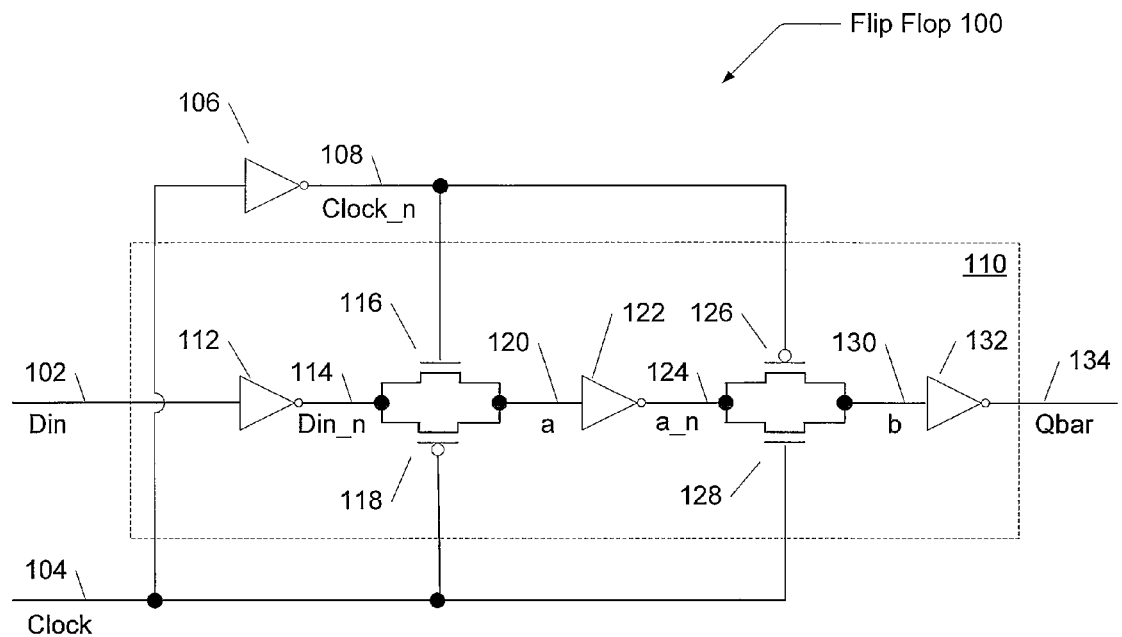
FIG. 1 is a generalized block diagram illustrating one embodiment of a flip-flop circuit.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, techniques, and transistor sizing methods have not been shown in detail to avoid obscuring the present invention.

Referring to FIG. 1, one embodiment of a flip-flop circuit 100 is shown. This particular embodiment is a positive-edge triggered flip-flop comprising pass-gates, or transmission gates, to implement a master latch and a slave latch. One skilled in the art knows other embodiments may include a negative-edge triggered design, and the master-slave configuration may be implemented with other transistor topologies such as sense amps, C2MOS topology, dynamic circuits, differential inputs, and other design choices. A clock signal is received by clock line 104. A transition of the clock signal (i.e. changing from a logic low value to a logic high value in the positive-edge triggered example) initiates logic value state changes within the flip-flop circuit 100. Output data from combinatorial logic, dynamic logic, sequential elements such as latches, other flip-flop circuits, or other is received by the data input line Din 102. A clock signal is received by input clock line 104. An inverter 106 provides a complementary value of the received clock signal on line 108.

Circuit 110 comprises one embodiment of a transmission-gate master latch and slave latch. In this embodiment, a master latch may be implemented by devices 112-118. Inverter 112 provides an inverted value, Din_n 114, of the value on line Din 102 to a transmission-gate implemented by transistors 116 and 118. A slave latch is implemented by devices 122-128. Inverter 122 provides an inverted value, a_n 124, of the output value, a 120, of the master latch transmission-gate. The slave latch transmission-gate is implemented by transistors 126 and 128. An inverter 132 buffers the output of the slave latch, b 130, and provides the output of the flip-flop circuit, Qbar 134. Output inverter 132 also isolates the output capacitance of the flip-flop circuit from the slave latch transmission gate.

The master latch and slave latch receive inverted clock signals respective of one another. In the positive-edge triggered embodiment shown, the clock lines 104 and 108 are coupled to the transmission gates in a manner to provide the respective inverted clocking. When the received clock signal on line 104 has a logic low value, the master latch is transparent and transmits values from the data input line 102 to node 120. At the same time, the slave latch is opaque and no data transmission from node 124 to node 130 occurs. When the clock signal on line 104 transitions from a logic low value to a logic high value, the reverse scenario occurs and the master latch is opaque and the slave latch is transparent.

In this manner, the output node 134 is dependent on the data input line 102 and the clock signal on line 104. For simplicity, feedback circuits are not shown, which would ensure the values present on nodes 120 and 130 are not lost when the master and slave latches becomes opaque. In the embodiment shown the output value on node 134 is an inverted value of the data input line 102 when the master latch becomes opaque. A separate output may be included in circuit 100 to convey a non-inverted value. Also, modern designs may have one of many embodiments of scan circuitry included in the flip-flop circuit 100 for testing purposes. Again, for simplicity, a scan circuit is not shown.

Figure 2:
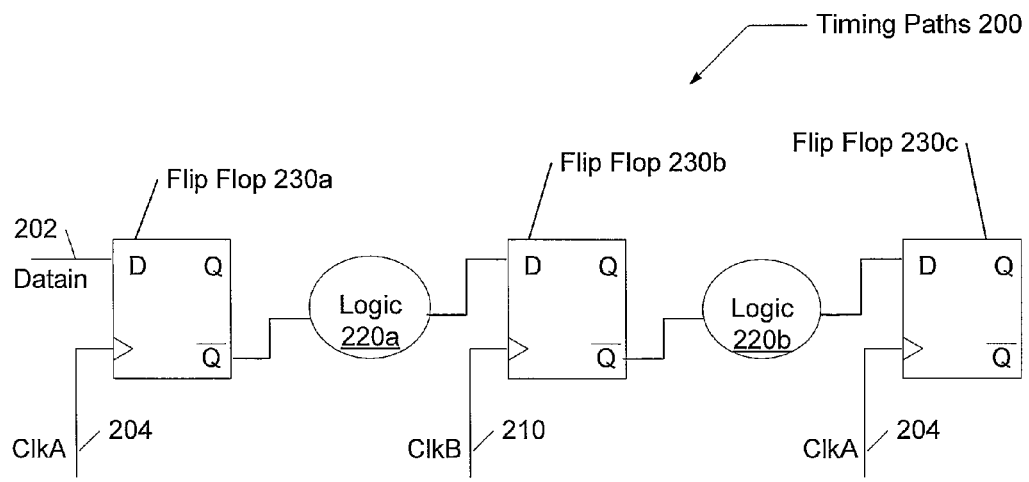
FIG. 2 is a generalized block diagram illustrating one embodiment of timing paths between sequential elements.

FIG. 2 illustrates one embodiment of a series of timing paths 200 using flip-flop circuits. This embodiment does not include all examples of timing paths such as replacing a flip-flop circuit with a single latch circuit, replacing combinatorial logic with dynamic logic, or replacing logic with a memory such as a random access memory (RAM) cell or a register file circuit. The embodiment shown is for a simple illustrative purpose.

Flip-flop circuits 230a-230c may use a master-slave latch configuration as shown in FIG. 1. Flip-flop circuits 230a-230c may also include single or double output lines, and one of many embodiments for feedback circuits and scan circuitry. As used herein, elements referred to by a reference numeral followed by a letter may be collectively referred to by the numeral alone. For example, flip-flop circuits 230a-230c may be collectively referred to as flip-flop circuits 230. A data input signal is received by line Datain 202. In this embodiment, flip-flops 230a and 230c receive a same clock signal, ClkA, on line 204. Flip-flop circuit 230b receives a clock signal, ClkB, on line 210. The reason for two different clock signals will be described below.

A first timing path exists between the output of flip-flop 230a and the input of flip-flop 230b. Combinatorial logic, Logic 220a, receives the output of flip-flop 230a, performs combinatorial computations dependent on the output of flip-flop 230a, and conveys an output value to the input of flip-flop 230b. A second timing path including logic 220b exists between flip-flops 230b-230c.

Figure 3:
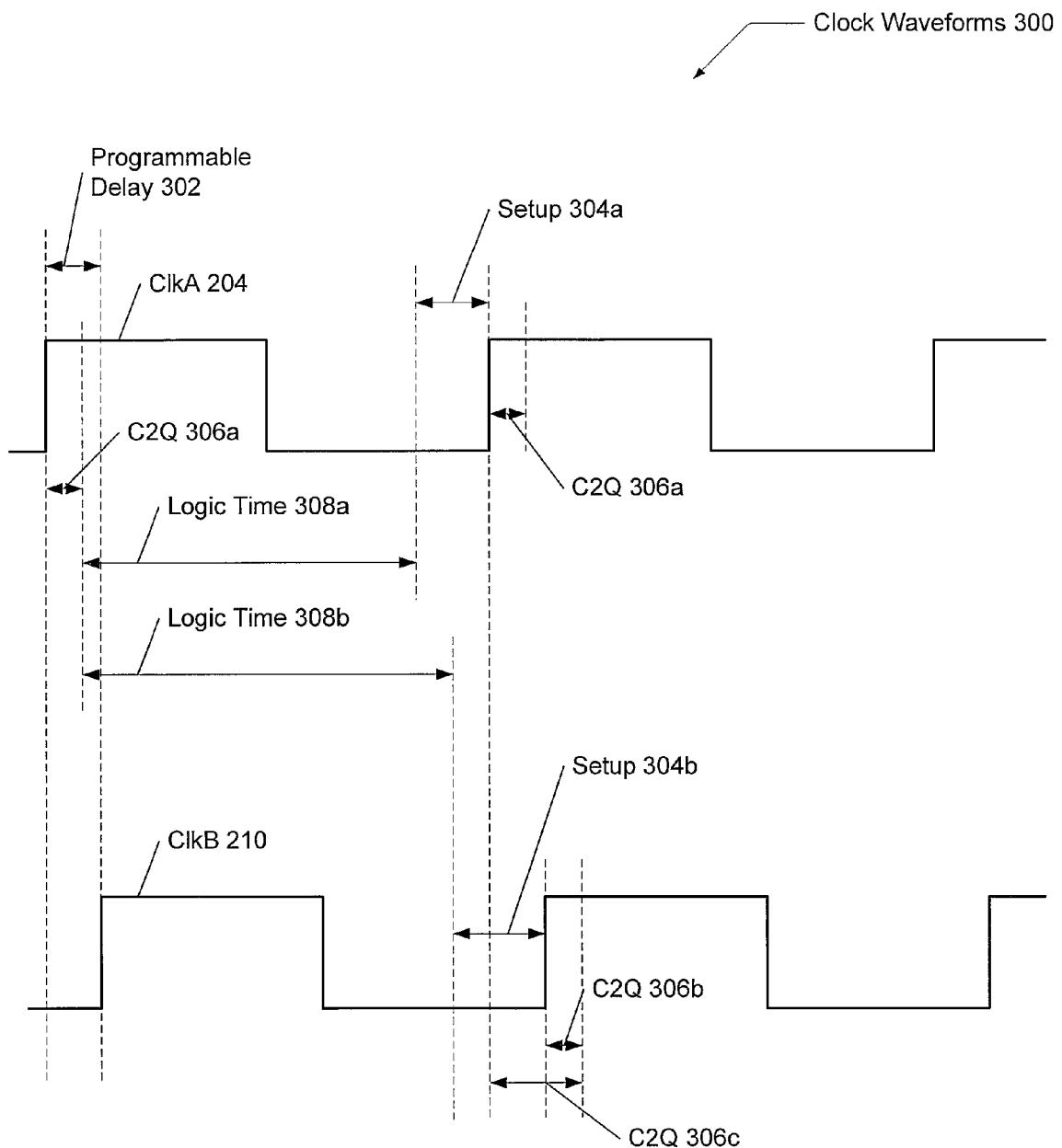
FIG. 3 illustrates one embodiment of clock waveforms used to define the timing requirements of timing paths on a semiconductor chip.

FIG. 3 illustrates one embodiment of the clock waveforms 300 used for the timing requirements of timing paths shown in FIG. 2. As can be seen here, clock waveform ClkB 210 has a same duty cycle as clock waveform ClkA 204, but is delayed from ClkA 204 by a programmable delay value 302. Flip-flop 230a may have a clock-to-Q value, C2Q 306a, which represents the delay between the time the clock signal rises and the output of flip-flop 230a is present on its output line. This delay may be due to the propagation delay of the slave latch, which includes the inverter delay to present an inverted clock signal to the slave latch, the inverter delay to supply the input value to the slave transmission-gate, the delay through the transparent slave transmission-gate, and the inverter output buffer delay. Not all of these delays are accumulated as separate values, since some of the delays may occur simultaneously such as the inverter delay for the clock signal and the inverter delay for the slave latch input.

Flip-flop 304a also has a setup time, Setup 304a, that requires the input signal on its input line to remain stable for a minimum duration prior to the rise of the clock signal. This duration may be defined by the delay of the inverter supplying the inverted input data value to the master transmission-gate and the delay of the master transmission-gate. If the data input signal is not stable for the setup duration prior to the clock rising, then the input data value may not have time to be stored by the master latch. Referring to FIG. 1 again, the input data value may not traverse to node 120 of the flip-flop circuit before the master transmission-gate becomes opaque. Therefore, timing analysis requires the data input signal be ready a setup time, such as Setup 304a, before the clock signal rises.

Referring to both FIG. 2 and FIG. 3, if flip-flop 230b also received the same clock signal, ClkA 204, then Logic 220a, may have a time duration to perform computations represented by Logic Time 308a. However, since flip-flop 230b receives delayed clock signal, ClkB 210, Logic 220a may have additional time to perform its computations or have more logic placed in the clock cycle. For example, flip-flop 230b may have a setup time, Setup 304b, of the same value as flip-flop 230a, Setup 304a. However, due to the delay value, Programmable Delay 302, Setup 304b occurs at an absolute time later than Setup 304a. Therefore, now Logic 220a has more time for computations represented by Logic Time 308b. Since the duty cycles of ClkA 204 and ClkB 210 are the same, the frequency of the design did not change, but more time was given to Logic 220a to perform computations.

The trade-off for this additional time is the subsequent timing path conveys a data input signal to Logic 220b at a later time. Flip-flop 230b may have a delay, C2Q 306b, that has a same value as the delay attributed to the C2Q delay of flip-flop 230a. However, due to the delay value, Programmable Delay 302, the output of flip-flop 230b is conveyed at a later absolute time than if flip-flop 230b received ClkA 204. The "perceived" C2Q delay of flip-flop 230b appears greater than C2Q 306b. The "perceived" value, C2Q 306c, is shown in FIG. 3 with respect to the rising edge of ClkA 204. If Logic 220b is able to allow this delayed input without interfering with its timing requirements, such as meeting the setup time of flip-flop 230c, then providing a delayed clock, ClkB 210, to flip-flop 230b permits Logic 220a to maintain its number of stages of delay without decreasing the clock frequency.

In one embodiment, the Programmable Delay 302, may be implemented in post-silicon, or after the semiconductor chip is fabricated and returned for testing. Failing timing paths, such as the timing path with Logic 220a, may be fixed in post-silicon by changing the clock signal supplied to flip-flop 230b from ClkA 204 to ClkB 210. One method of performing this change in post-silicon is Referring now to FIG. 4, one embodiment of a clock delay circuit 400 for providing a programmable delay for a clock signal in post-silicon is provided. A clock signal generated by global clock distribution system to a local clock generation circuitry is received by the line clkin 402. An inverter 404 provides an inverted signal to node clkin_n 406. An inverter 408 provides an output clock signal to output line clkout 410. Inverters 412 and 416 provide a delayed inverted value, clkbuf_n 418, of clkin 402 to clock delay cells 450. Delay inputs 440 are supplied to the clock delay cells 450. These inputs may be supplied by pre-existing scan registers.

Each clock delay cell 450 has an input line, open 430. An inverter 432 provides an inverted value, open_n 434, of the input open 430 to a transmission-gate implemented by transistors 436 and 438. The input line b 440 receives the delayed inverted clock signal clkbuf_n 418. The transmission-gate propagates the signal clkbuf_n 418 to its output line a 442, which is coupled to the node clkin_n 406. Also, the delay through inverters 412 and 416 may be designed to be at least the value of the transition time of the charging or discharging of the node 406. In this manner, when one or more clock delay cells 450 receive a logic high value on lines 440 from a scan register, the transmission-gates within cells 450 are transparent, and the time for the output clock signal on line 410 to transition increases. This delay is due to the drive fight seen on node 406. For example, if node 406 has a logic low value, then node 418 also has a logic low value. If one or more cells 450 have transparent transmission-gates, each transmission-gate has a logic low value on both its input and its output. As node 406 transitions to a logic high value, inverter 404 must fight with the transparent transmission-gates of cells 450 that are attempting to maintain a logic low value on node 406. The fact that the delay through inverters 412 and 416 may be at least the same as the transition time of node 406 helps provide this fight. If the delay through inverters 412 and 416 is much smaller than the transition time of node 406, the transmission-gates would begin to help node 406 transition, rather than fight the transition, and a delay of the clock signal would not be as appreciable.

Figure 5:
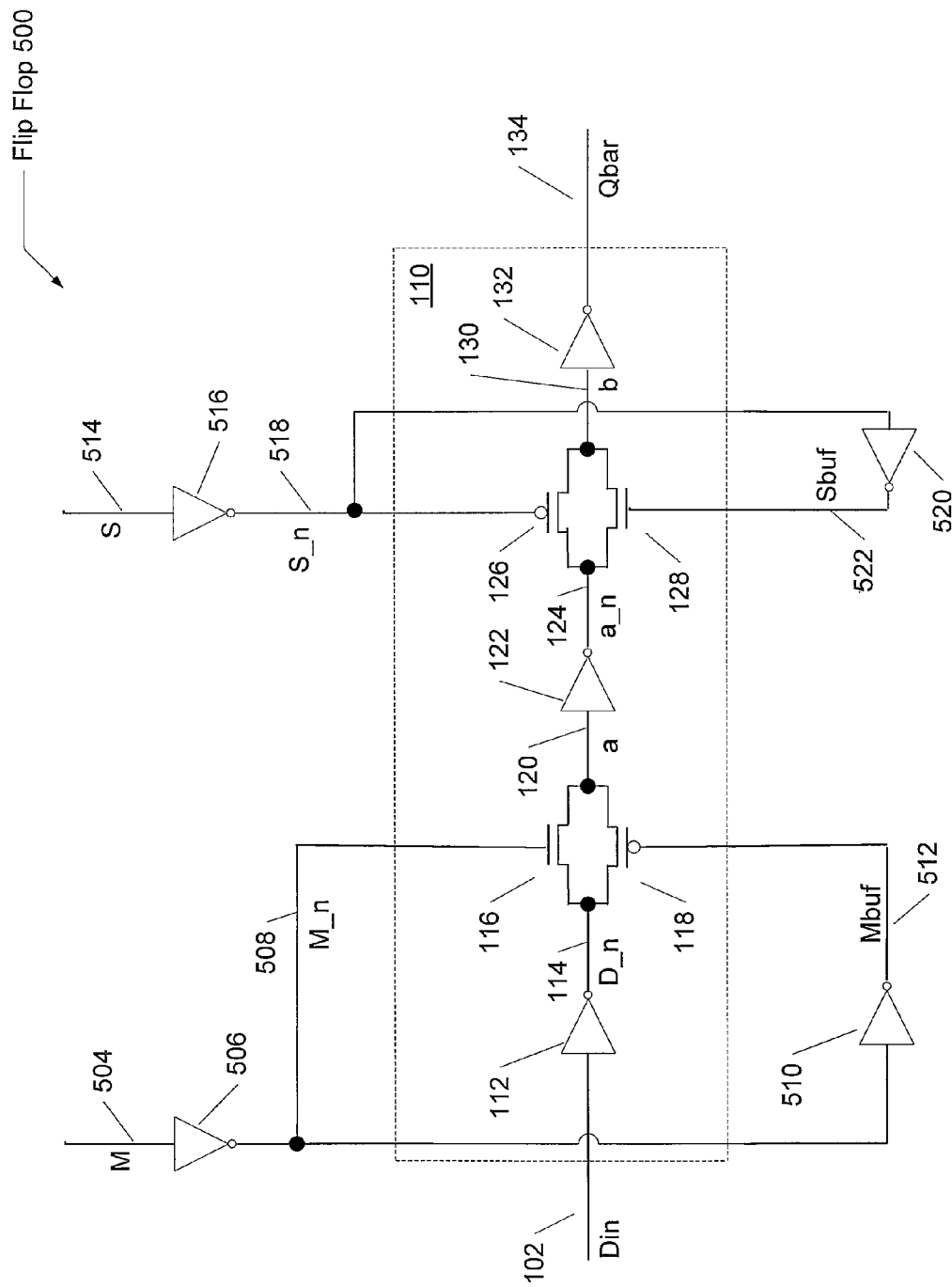
FIG. 5 illustrates one embodiment of a flip-flop circuit with split clocks.

FIG. 5 illustrates one embodiment of a flip-flop circuit 500 similar to the circuit 110 of FIG. 1 with similar items similarly numbered. However, the embodiment of FIG. 5 utilizes split clocks. In circuit 110 of FIG. 5 both a master latch and a slave latch are provided. A data input signal is received via line 102. A master clock signal is received by line 504. Inverters 506 and 510 provide inverted and non-inverted clock signals 508 and 512, respectively. These clock signals determine when the master latch is transparent and opaque.

A separate slave clock signal is received via line 514. Inverters 516 and 520 provide inverted and non-inverted clock signals 518 and 522, respectively. These clock signals determine when the slave latch is transparent and opaque.

Figure 6:
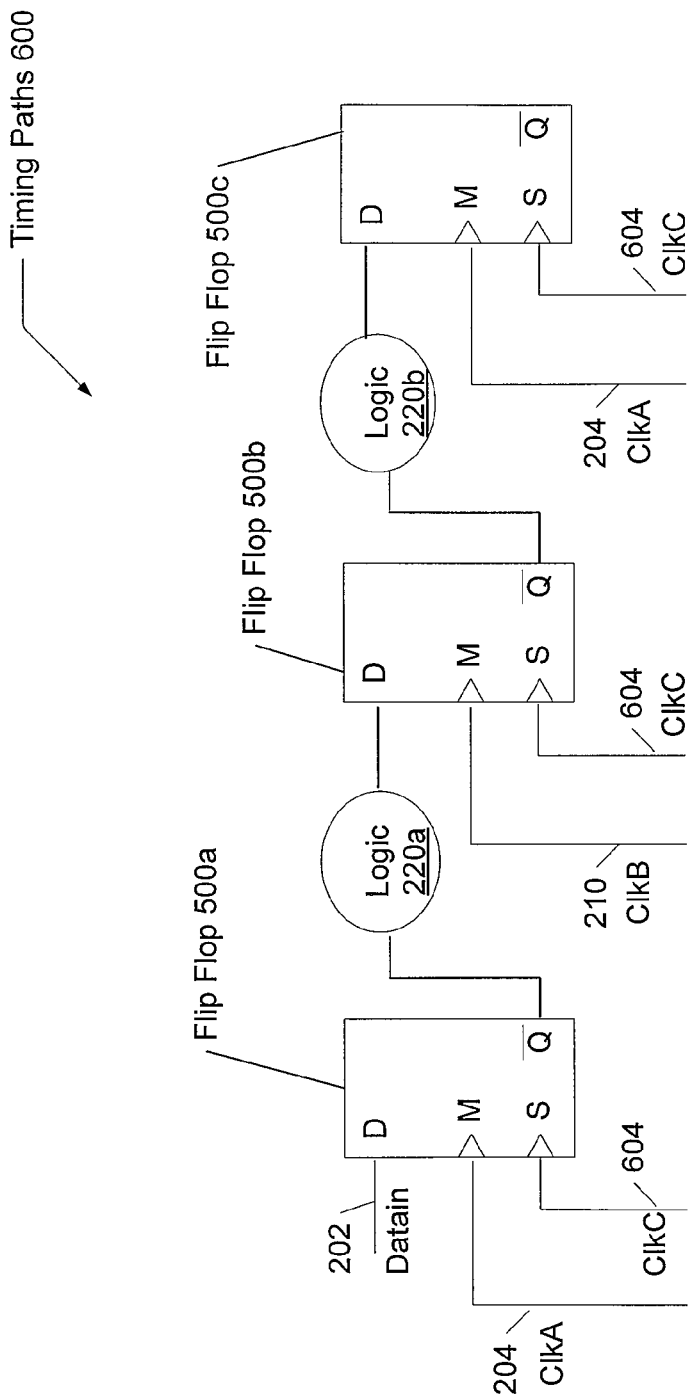
FIG. 6 illustrates one embodiment of a series of timing paths using flip-flop circuits with split clocks.

FIG. 6 illustrates one embodiment of a series of timing paths 200 using flip-flop circuits with split clocks. This embodiment as with the embodiment shown in FIG. 2 does not include all examples of timing paths, but shows one example for a simple illustrative purpose.

Flip-flop circuits 500 may use a master-slave latch configuration. Flip-flop circuits 500 may also include single or double output lines, and one of many embodiments for feedback circuits and scan circuitry. A data input signal is received by line Datain 202. In this embodiment, flip-flops 500a and 500c receive a same master clock signal, ClkA, on line 204. Flip-flop circuit 500b receives a master clock signal, ClkB, on line 210. Each flip-flop 500 receives a slave clock signal ClkC on line 604. A description of these clock waveforms is described next.

Figure 4:
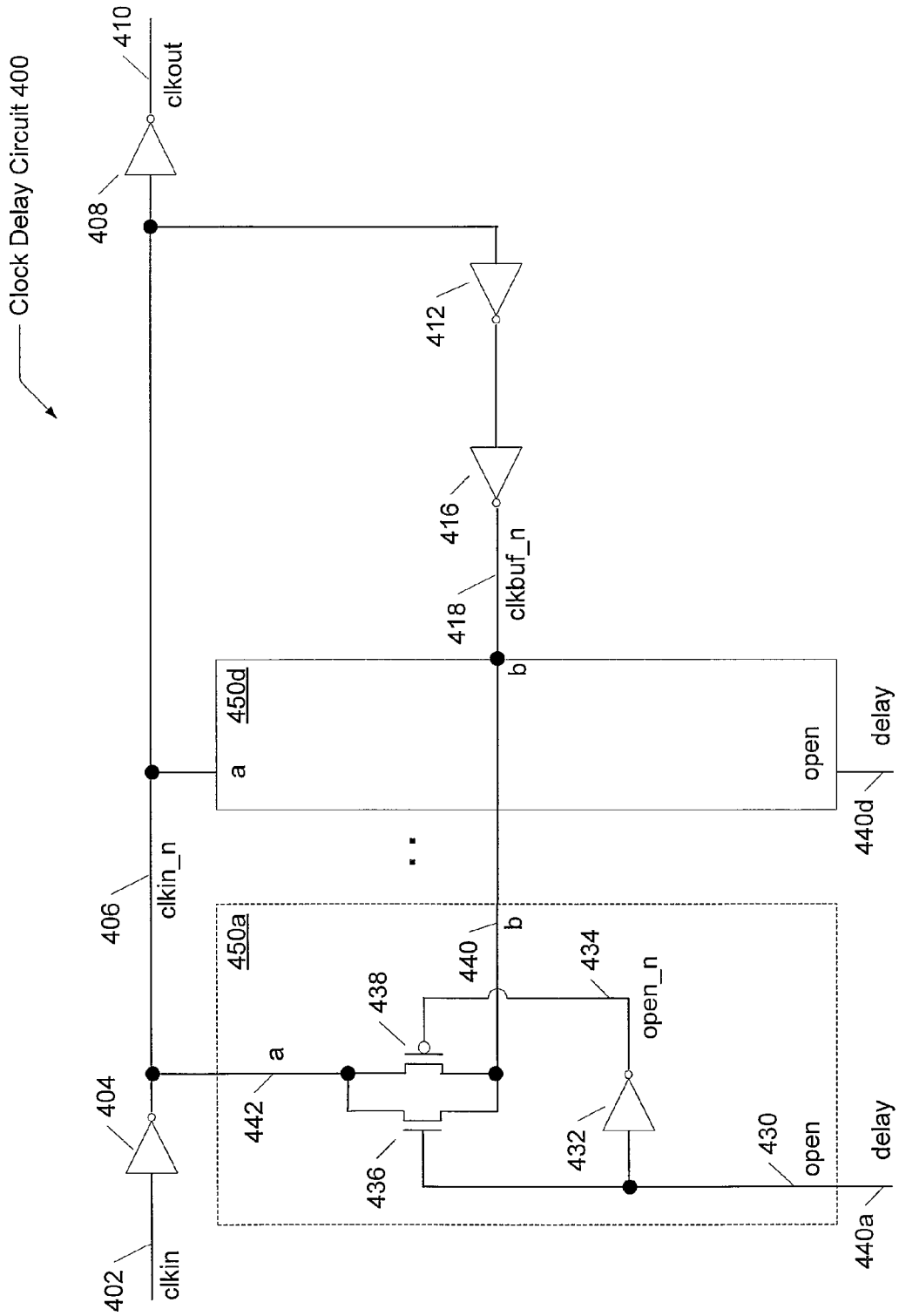
FIG. 4 illustrates one embodiment of a clock delay circuit for providing a programmable delay for a clock signal in post-silicon.
Figure 7:
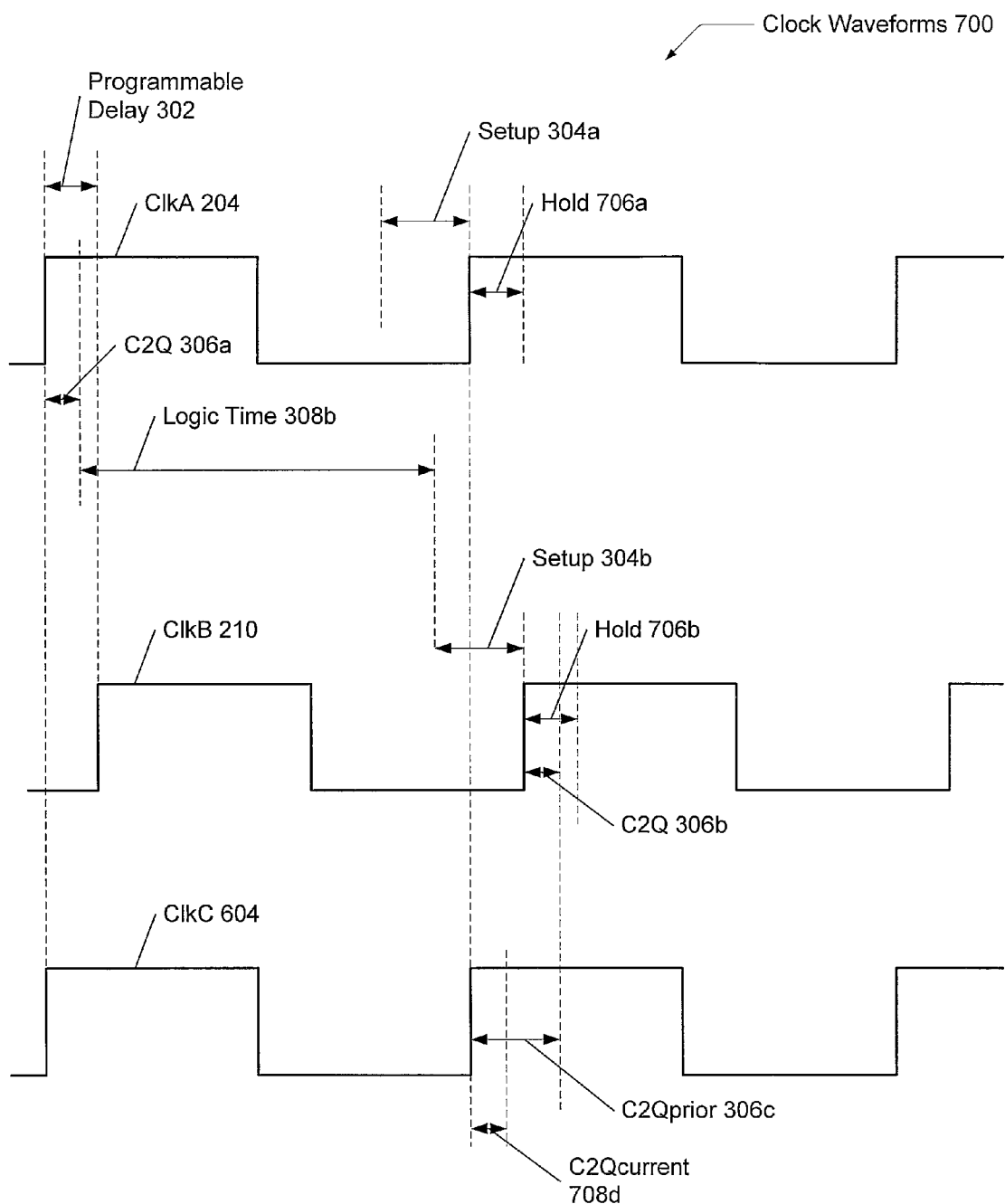
FIG. 7 illustrates one embodiment of clock waveforms used to define the timing requirements of timing paths on a semiconductor chip with split clocks.

FIG. 7 illustrates one embodiment of the clock waveforms 700 used for the timing requirements of timing paths shown in FIG. 6. As can be seen here, master clock waveform ClkB 210 has a same duty cycle as master clock waveform ClkA 204, but is delayed from ClkA 204 by a programmable delay value 302. In one embodiment, this delay may be implemented by a clock delay circuit as shown in FIG. 4. In alternative embodiments, other delay circuits may be used. Slave clock waveform ClkC 604 is shown to have the same duty cycle as master clock waveform ClkA 204 with no delay. In alternative embodiments, a non-zero delay may exist between master clock ClkA 204 and slave clock ClkC 604 and this delay value may be different from the value of the programmable delay 302.

Flip-flop 500*a* may have a clock-to-Q value, C2Q 306*a*, which represents the delay between the time the clock signal rises and the output of flip-flop 500*a* is present on its output line. This delay may actually be a different numerical value than the previously shown value 306*a*, but is shown as the same value here for simplified illustrative purposes. Likewise, flip-flop 500*a* may have a setup time of Setup 304*a*. Also, flip-flop 500*a* may have a hold time value of Hold 706*a* that requires the input signal on its input line to remain stable for a minimum duration subsequent the rise of the clock signal. This duration may be defined by the delay of the inverter supplying the inverted input data value to the master transmission-gate and the delay of the master transmission-gate. If the data input signal is not stable for the hold duration subsequent to the clock rising, then the input data value may have time to over-write the required value to be stored by the master latch. Referring to FIG. 1 again, the input data value may traverse to node 120 of the flip-flop circuit before the master transmission-gate becomes opaque. Therefore, timing analysis requires the data input signal remain constant a hold time, such as Hold 706*a*, after the clock signal rises.

Flip-flop 500*b* may have a setup time, Setup 304*b*. Due to the programmable delay 302 that delays the clock edge transitions of master clock waveform ClkB 210 with respect to master clock waveform ClkA 204, Logic 220*a* has more time for computations represented by Logic Time 308*b*. Since the duty cycles of ClkA 204 and ClkB 210 are the same, the frequency of the design did not change, but more time was given to Logic 220*a* to perform computations.

Unlike the previous example of a delayed clock that provided more computation time, this implementation does not increase the perceived C2Q value of the subsequent timing path. Flip-flop 500*b* has a separate slave clock waveform ClkC 604, which is not delayed in this embodiment. Therefore, the C2Q delay of flip-flop 500*b* is shown as C2Q 708*d*. In the previous example in FIG. 3 the slave clock was delayed the same as the master clock to the receiving flip-flop of the first timing path (i.e. flip-flop 230*b*). If that were the case here and flip-flop 500*b* received a delayed slave clock, the C2Q delay of flip-flop 500, C2Q 306*b*, would be delayed and provide the perceived delay value of C2Q 306*c*. However, this is no longer the case as flip-flop 500*b* has a separate slave clock, ClkC 604, which is not delayed.

However, there is a trade-off. The hold time of flip-flop 500*b*, Hold 706*b*, is delayed, since its master clock waveform, ClkB 210, is delayed. Therefore, Logic 220*a* must provide a stable value to the input of flip-flop 500*b* for a longer duration than required without a delayed master clock. However, this timing requirement may be easily many for many paths.

Figure 8A:
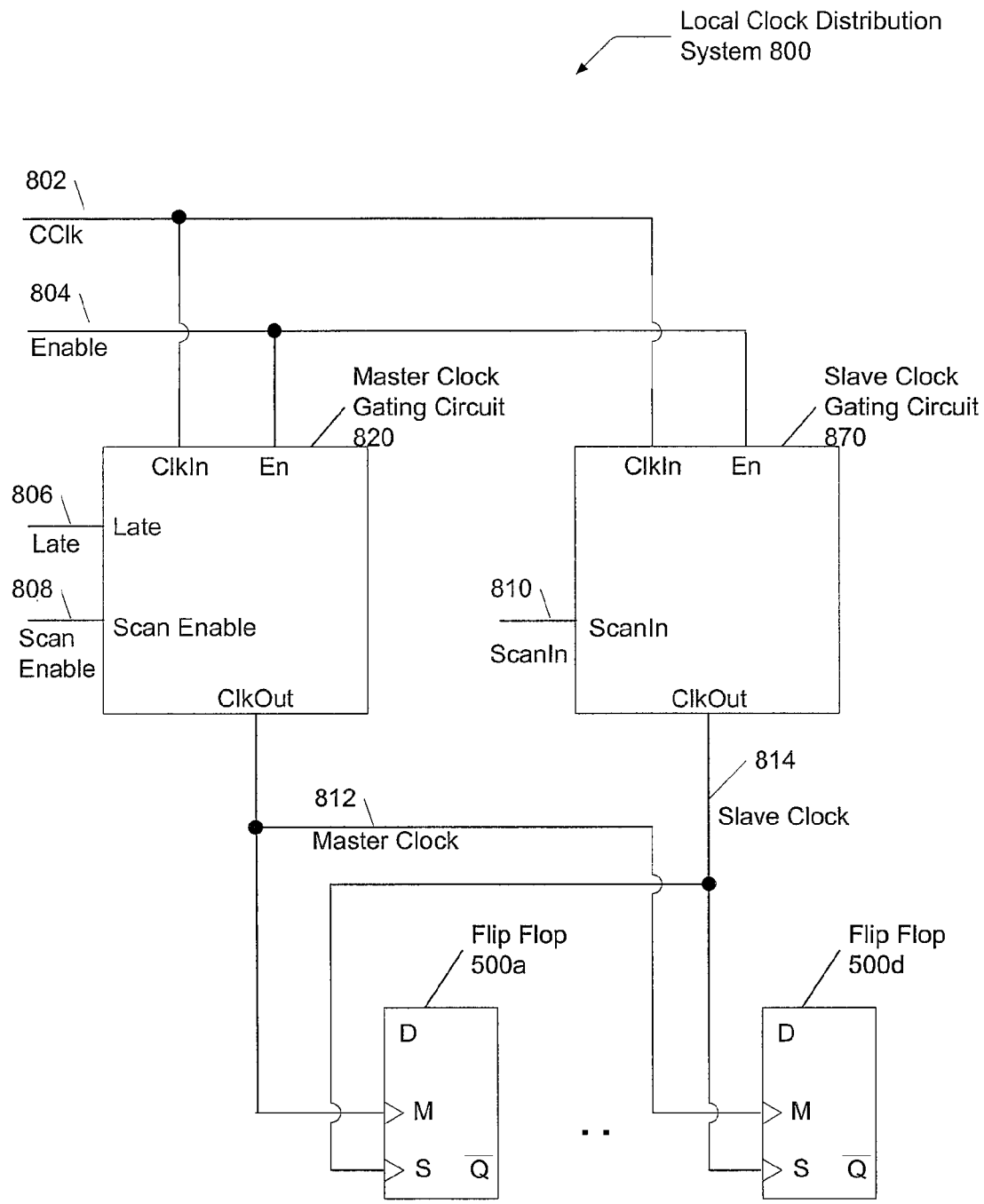
FIG. 8A illustrates one embodiment of a local clock distribution system for split clocks.

Referring to FIG. 8A, one embodiment of a local clock distribution system 800 is shown. System 800 may be used to supply split clocks 812 and 814 to flip-flops 500. A common clock, CClk 802, may be generated by a global clock distribution system floorplanned across the die of the semiconductor chip. This clock signal is received by a master clock gating circuit 820 and a slave clock gating circuit 870, which are used to provide the split clocks 812 and 814 to the flip-flops 500. A control signal, Enable 804, may be used for power management purposes and is coupled to both gating circuits 820 and 870. This control signal may be used to disable the generation of local clocks in order to save power when it is known the local circuits do not need to perform computations.

Scan inputs 808 and 810 may be used for testing purposes and are coupled to the gating circuits 820 and 870, respectively. Also, a control signal, late 806, may be used to provide additional delay between the master clock 812 and slave clock 814. This control signal is coupled to the master clock gating circuit 820.

Figure 8B:
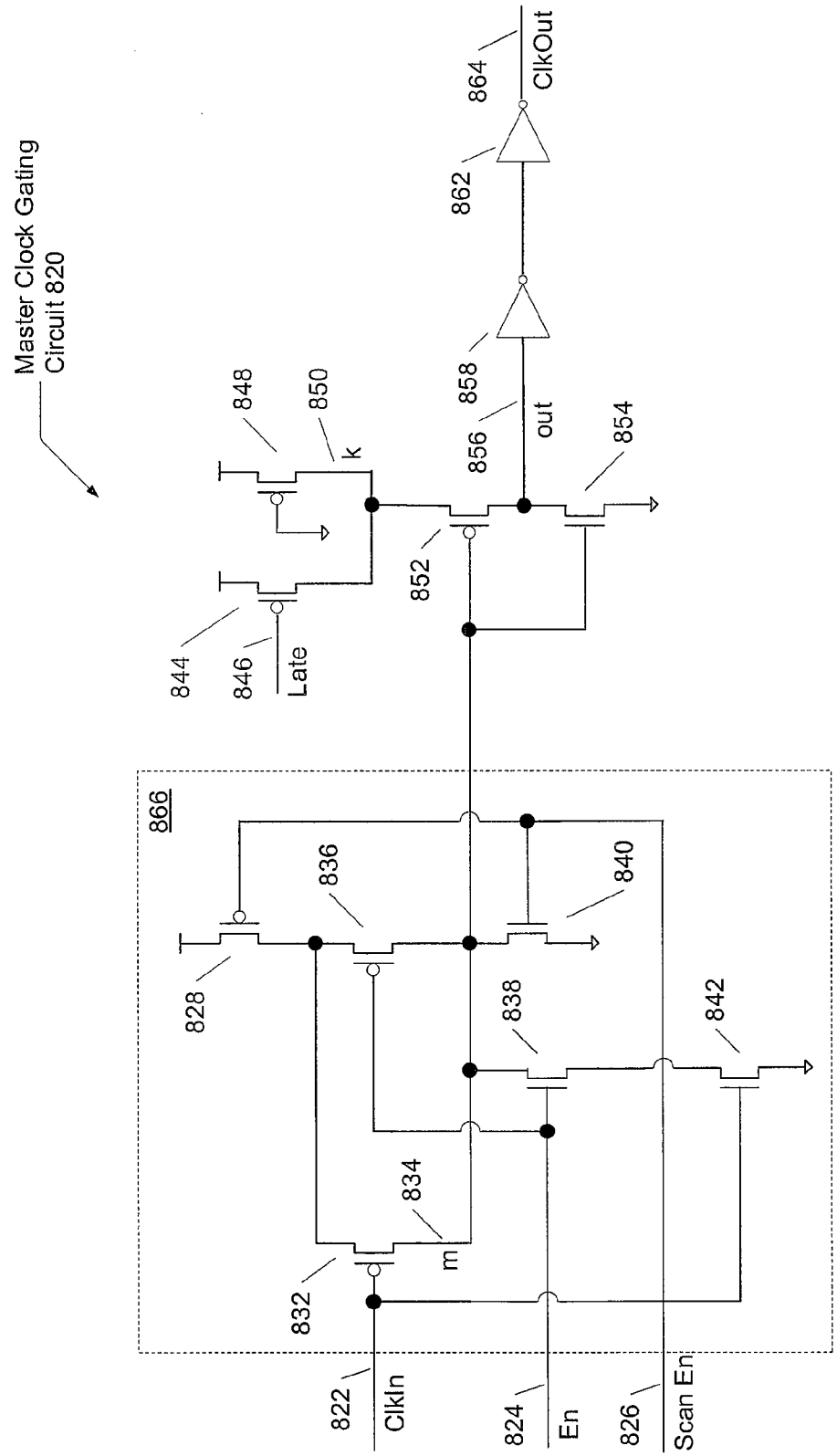
FIG. 8B illustrates one embodiment of a master clock gating circuit used in a system with split clocks.

FIG. 8B illustrates one embodiment of a master clock gating circuit 820. Circuit 866 is a CMOS AND-OR-Invert (AOI) logic gate with an earlier stage clock input, ClkIn 822, an enable control input, En 824, and a testing scan enable input, Scan En 826. NMOS transistors 838, 840, and 842 provide the logic function. PMOS transistors 828, 832, and 836 provide the complementary version of this logic function. When the input signal, Scan En 826, is asserted, the output line m 834 is discharged to a logic low value regardless of the values of the other inputs. When the input Scan En 826 is deasserted and the input En 824 is deasserted, the output line m 834 is charged to a logic high value regardless of the toggling clock input, ClkIn 822. When the Scan En 826 input is deasserted and the control input signal, En 824, is asserted, the output line m 834 toggles between inverted values of the clock input ClkIn 822.

There are three levels of inversions following the AOI circuit 866. Therefore, the output line ClkOut 864 is in phase with input clock signal ClkIn 822. The first inversion uses a modified inverter with PMOS transistors 844 and 848 stacked on top of PMOS transistor 852. The gate input of transistor 848 is coupled to the ground reference and always conducts current to charge intermediate node k 850. Transistors 848 and 852 may be long channel devices, which slow the propagation delay through each transistor and adds delay to the output transitions on node 856. Transistor 844 may be sized larger than transistor 848. In one embodiment, transistor 844 may have a channel width three times the width of transistor 848. Alternative embodiments may use other sizing ratios.

The gate input of transistor 844 is coupled to the control signal Late 846. When it is desired to add an additional delay to the output line ClkOut 864, the control signal Late 846 is set to a logic high value. Transistor 844 is turned off and stops conducting current. Now transistor 844 no longer aids transistor 848 in charging intermediate node 850 and no longer aids the transistor 852 in charging node 856.

When an additional delay is not required on clock output line 864, the control signal Late 846 may be reset to a logic low value, transistor 844 is turned on, conducts current, and it aids transistor 852 with charging node 856.

Transistor 854 is the NMOS portion of the first inverter and discharges node 856 when the node 834 charges up to a logic high value. Node out 856 is in phase with the clock input signal on line ClkIn 822. Inverters 858 and 862 further buffer the output line 856 and propagate the clock output signal to flip-flop circuits. There may be several master clock gating circuits 820 of different sizes, and thus, of different drive strengths. The particular gating circuit 820 chosen depends on the capacitive load it needs to drive, wherein the capacitive load is dependent upon the number of flip-flips coupled to receive a clock input signal from the gating circuit 820, the sizes of these flip-flops, and the metal routes used to transport the clock signal to the different flip-flops.

Figure 8C:
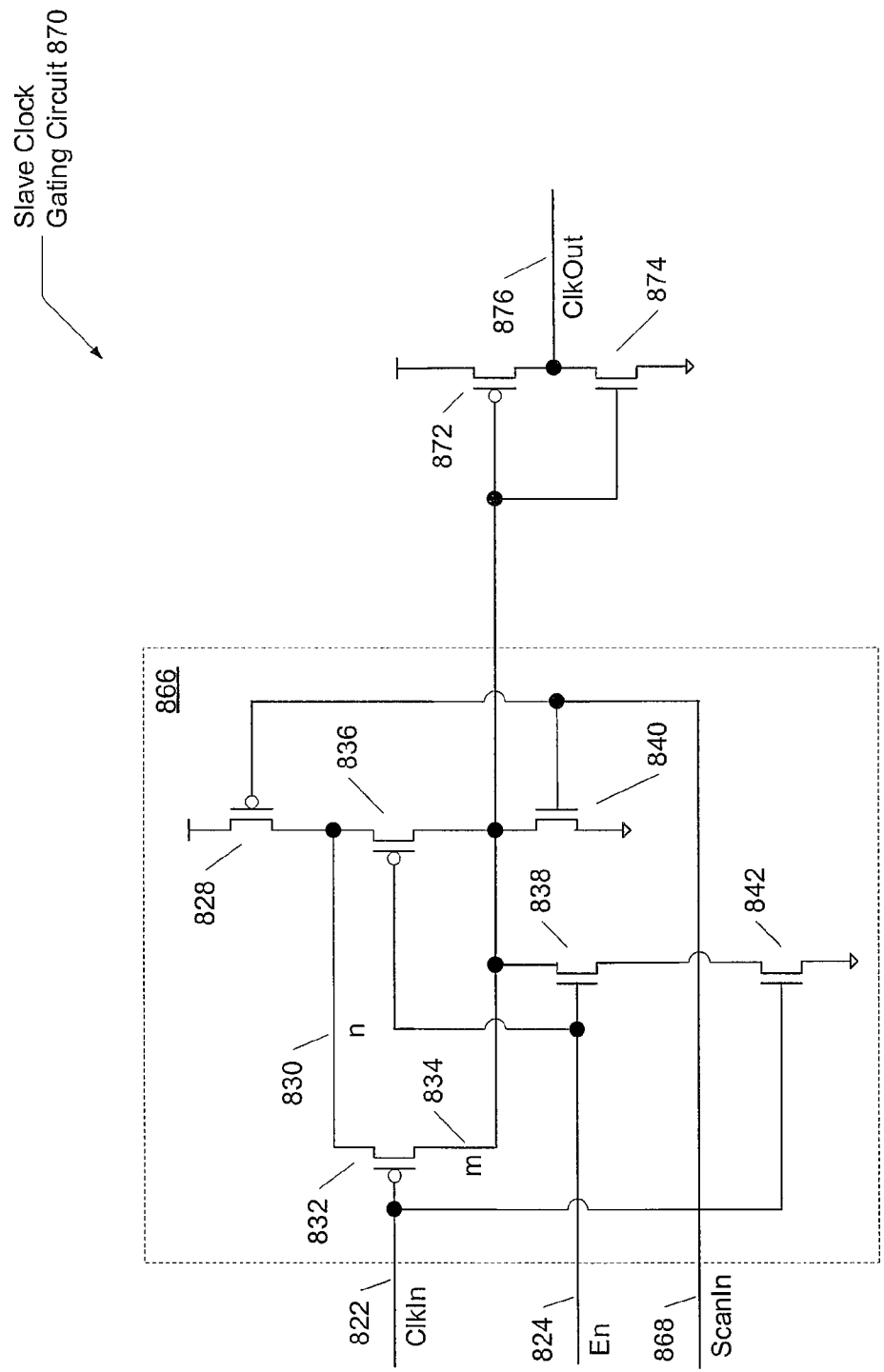
FIG. 8C illustrates one embodiment of a slave clock gating circuit used in a system with split clocks.

FIG. 8C illustrates one embodiment of a slave clock gating circuit 870. The AOI logic gate 866 topology is used in the slave clock gating circuit 870 as well, although the transistor sizes may be different. The testing scan input, ScanIn 868, replaces the ScanEn 826 input used in FIG. 8B. A single inverter buffers the output of the AOI circuit 866. The inverter is implemented with transistors 872 and 874. The output clock line 876 is propagated to the flip-flops. As with the master clock gating circuit 820, there may be several slave clock gating circuits 870 of different sizes, and thus, of different drive strengths. The particular gating circuit 870 chosen depends on the capacitive load it needs to drive, wherein the capacitive load is dependent upon the number of flip-flips coupled to receive a clock input signal from the gating circuit 820, the sizes of these flip-flops, and the metal routes used to transport the clock signal to the different flip-flops.

Figure 9A:
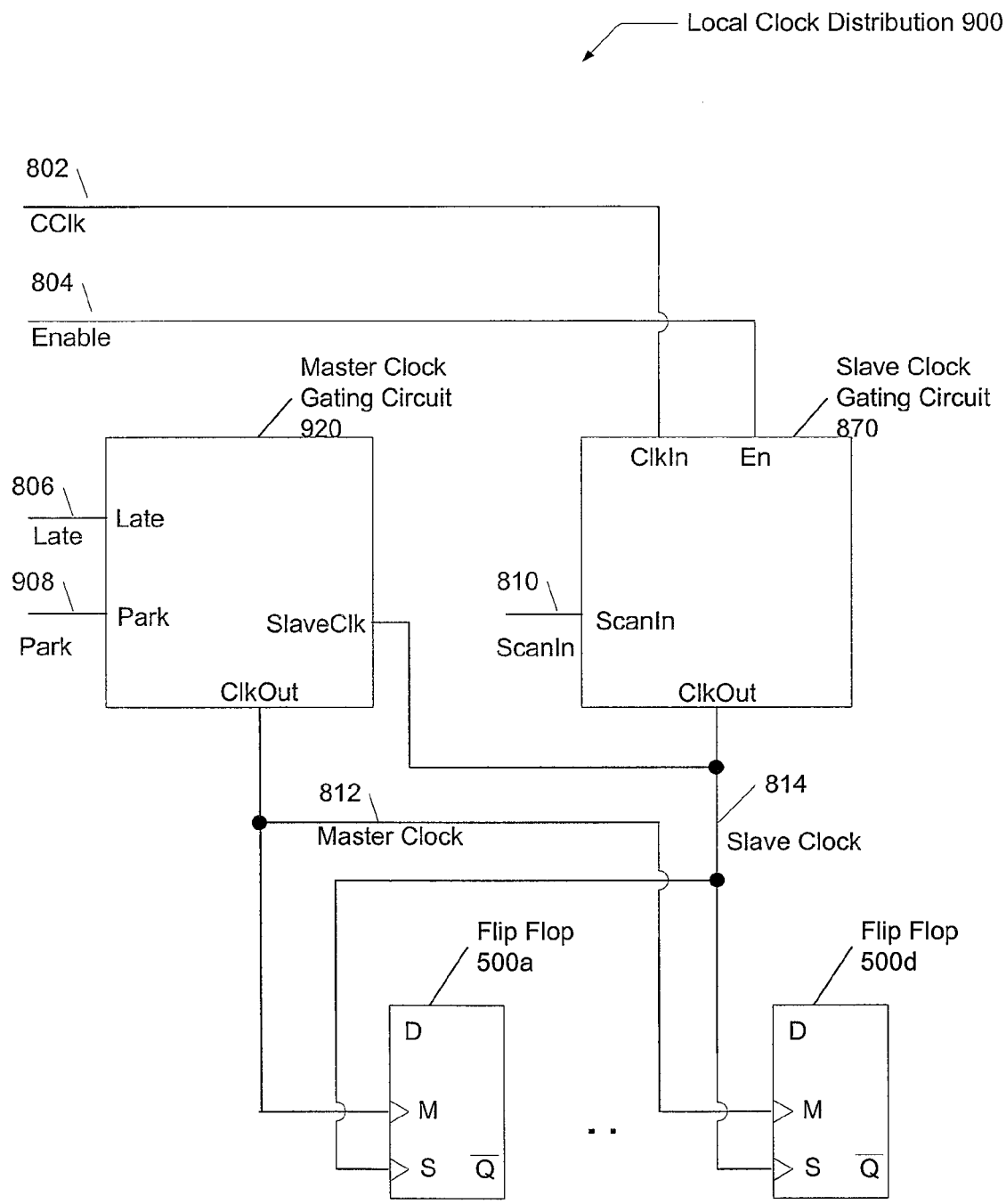
FIG. 9A illustrates an alternative embodiment of a local clock distribution system for split clocks.

Referring to FIG. 9A, an alternative embodiment of a local clock distribution system 800 is shown. System 900 may be used to supply split clocks 812 and 814 to flip-flops 500. A common clock, CClk 802, may be generated by a global clock distribution system floorplanned across the die of the semiconductor chip. Cclk 802 is received only by slave clock gating circuit 870. A control signal, Enable 804, may be used for power management purposes and may be coupled only to gating circuit 870.

Scan input 810 is coupled to the gating circuit 870. The control signal, late 806, is coupled to the master clock gating circuit 920. Also, the output, slave clock 814, is coupled to the gating circuit 920. A control signal, park 908, is received by the gating circuit 920 for power management reasons.

Figure 9B:
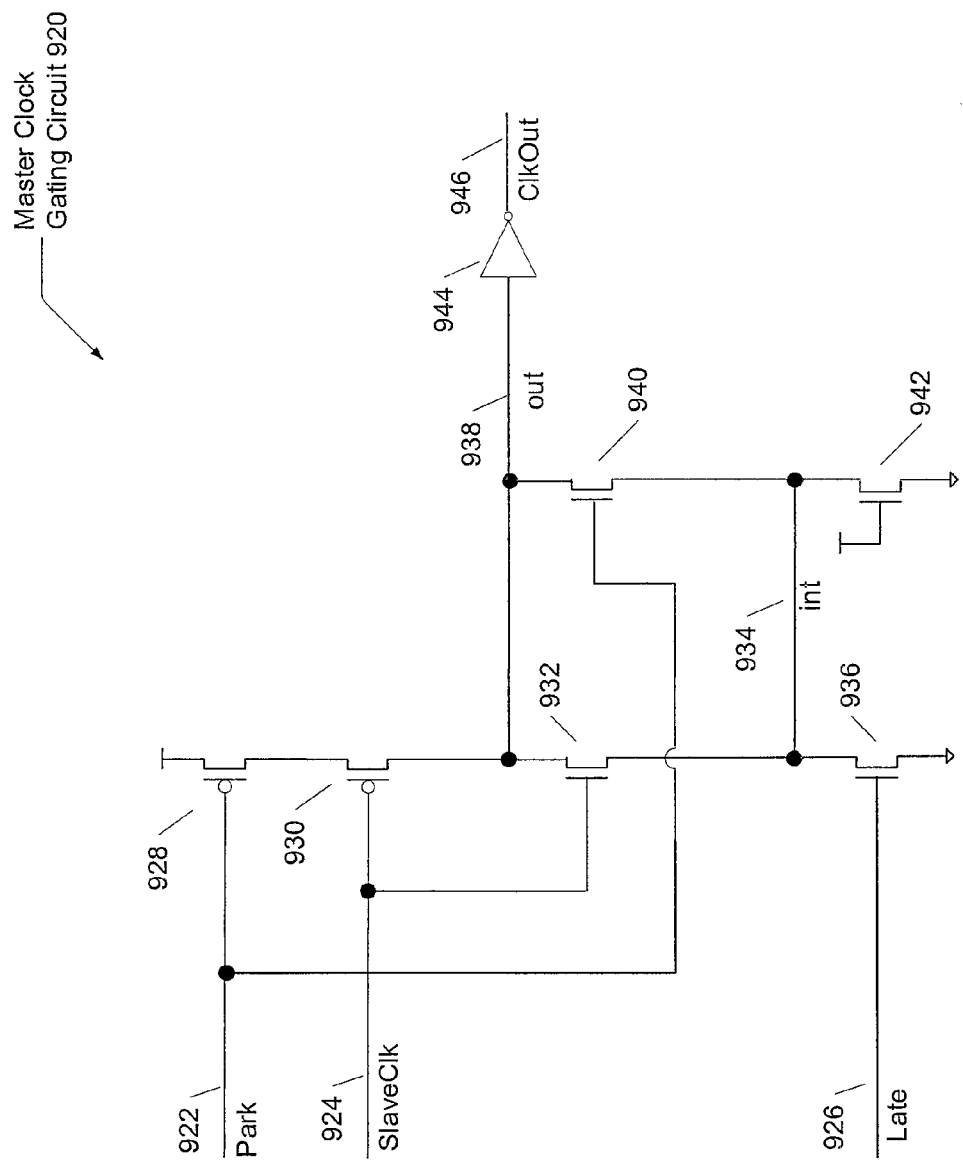
FIG. 9B illustrates an alternative embodiment of a master clock gating circuit used in a system with split clocks.

FIG. 9B illustrates an alternative embodiment of the master clock gating circuit 920. If the input signal park 922 is set to a logic high value, the output node 938 is discharged through transistors 940 and 942. Inverter 944 buffers this node and provides a constant logic high value on the output clock line 946. If the input signal park 922 is reset to a logic low value, node 938 toggles with inverted values of an earlier stage clock input signal, SlaveClk 924. The clock signal output on line 946 is in phase with the input clock signal on line 924. The input clock signal 924 is the slave clock provided by the slave clock gating circuit 870.

The gate input of transistor 942 is coupled to the power reference and always conducts current to discharge intermediate node int 934. Transistors 932 and 942 may be long channel devices, which slow the propagation delay through each transistor and adds delay to the output transitions on node 838. Transistor 936 may be sized larger than transistor 942. In one embodiment, transistor 936 may have a channel width three times the width of transistor 942. Alternative embodiments may use other sizing ratios.

The gate input of transistor 936 is coupled to the control signal Late 926. When it is desired to add an additional delay to the output line ClkOut 946, the control signal Late 926 is reset to a logic low value. Transistor 936 is turned off and stops conducting current. Now transistor 936 no longer aids transistor 942 in discharging intermediate node 934 and no longer aids transistor 932 in discharging node 938.

When an additional delay is not required on clock output line 946, the control signal Late 926 may be set to a logic high value, transistor 936 is turned on, conducts current, and it aids transistor 932 with discharging node 938.

Comparing the alternative embodiment of the master clock gating circuit in FIG. 9B with the embodiment shown in FIG. 8B, it can be seen that the configuration in FIG. 9B of transistors 932, 936, and 942 is similar to the configuration in FIG. 8B of transistors 852, 846, and 848. Both sets of transistors are used to provide an optional additional delay to the output clock signal by means of reducing current flow between a pre-buffered clock node and a first power reference. In FIG. 9B, the first power reference is a ground reference. In FIG. 8B, the first power reference is a voltage reference.

Figure 10:
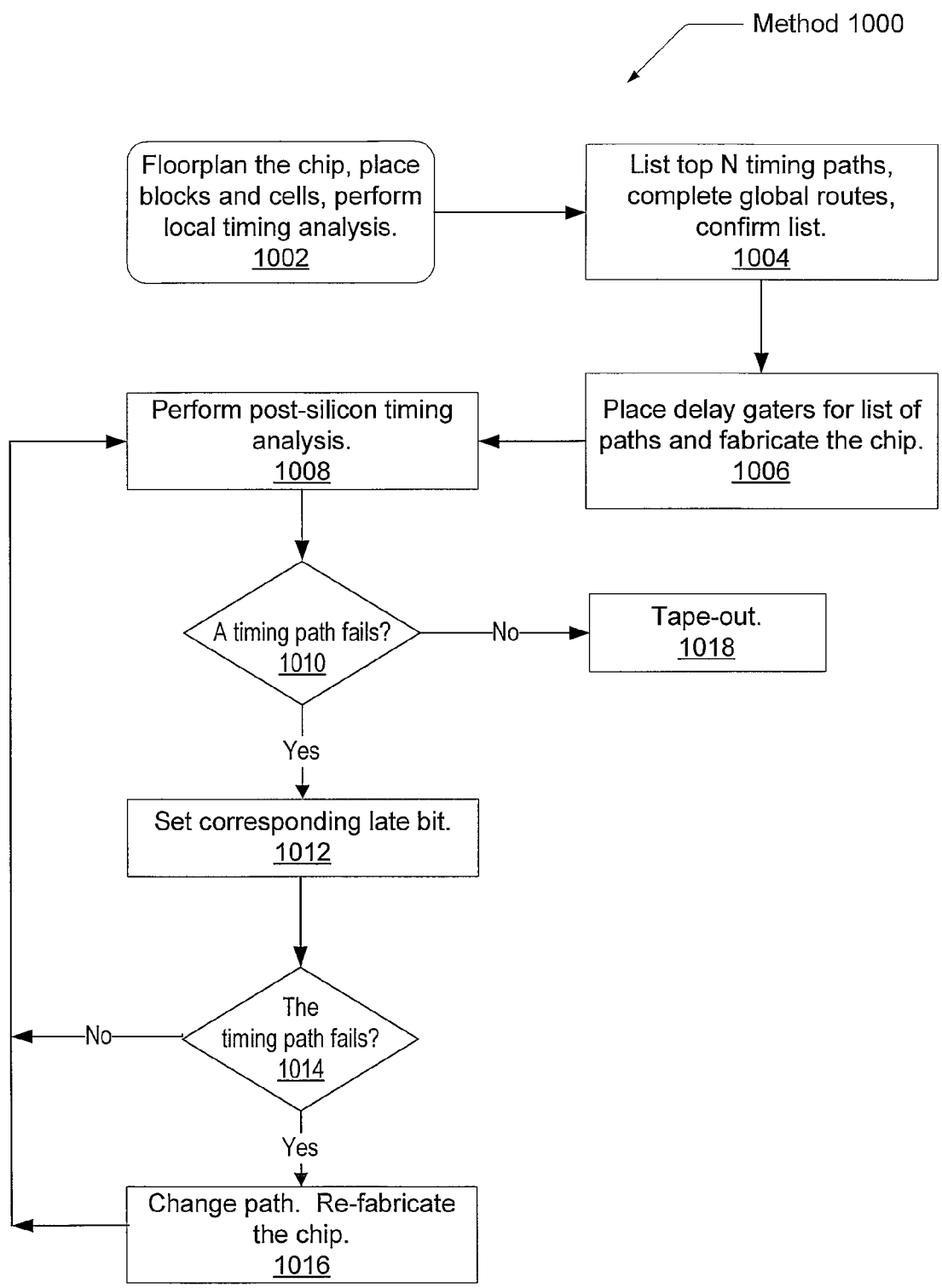
FIG. 10 illustrates one embodiment of a method for efficient improvement of timing analysis for faster processor designs.

FIG. 10 illustrates a method 1000 for efficient improvement of timing analysis for faster processor designs. Method 1000 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment. In the embodiment shown, a semiconductor chip is floorplanned, individual blocks are designed and placed, and local timing analysis is performed in block 1002. A list of the top N timing paths that do not meet timing requirements or meet the timing requirements by a small threshold is documented. Global routing may be completed and a more accurate timing analysis is performed. The list of the top N timing paths may be adjusted in block 1004.

The master clock gating circuits with a delay input are placed on the chip for the N top timing paths and the chip is sent for fabrication in block 1006. When the semiconductor chip returns, post-silicon timing analysis is performed. Variations between the behavior of the fabricated chip and the pre-silicon simulation models may be observed in block 1008. If a timing path fails in block 1010, its corresponding late bit may be set or reset to add delay to the master clock of the receiving flip-flop in block 1012. Whether or not this control input signal, late, is set or reset depends on the embodiment of the master clock gating circuit. Also, alternative embodiments may use multiple bits to determine a fine granularity of choices for the amount of delay to add to the master clock.

If the timing path continues to fail either by not meeting a setup time requirement or not meeting a hold time requirement, then the path needs to be changed. Either the corresponding block needs to have layout changes occur or the block needs to be resynthesized. The chip needs to be refabricated with the new design fixes in block 1016 and flow returns to block 1008.

If no timing paths fail in block 1010, and the chip meets any other desired design requirements such as architecture specifications, then the chip is ready for production and may be taped-out (block 1018).

Although the embodiments above have been described in considerable detail, numerous variations and modifications will become apparent to those skilled in the art once the above disclosure is fully appreciated. It is intended that the following claims be interpreted to embrace all such variations and modifications

What is claimed is:

1. A clock distribution system comprising:
a master clock gating circuit configured to generate a master clock signal from an earlier stage clock signal;
a slave clock gating circuit configured to generate a slave clock signal; and
a flip-flop circuit comprising a master clock input coupled to receive the master clock signal, and a slave clock input coupled to receive the slave clock signal;
wherein the master clock gating circuit is configured to:
select a delay based on a delay control signal, wherein the delay determines an additional amount of time the master clock signal transitions after the slave clock signal transitions, wherein selecting the delay with the delay control signal is performed with the use of a pre-existing scan register;

wherein said master clock gating circuit and said slave clock gating circuit each are further configured to convey a corresponding clock signal to a plurality of flip-flop circuits.

2. The clock distribution system as recited in claim 1, wherein the master clock gating circuit further comprises:
   a first transistor having a first drain terminal coupled to a pre-buffered clock node, a first gate terminal coupled to receive an earlier stage clock signal, and a first source terminal coupled to an intermediate node;
   a second transistor having a second drain terminal coupled to the intermediate node, a second gate terminal coupled to receive said delay control signal, and a source terminal coupled to a first power reference; and
   a third transistor having a third drain terminal coupled to the intermediate node, a third gate terminal coupled to a second power reference opposite in logic value of the first power reference, and a third source terminal coupled to the first power reference.

3. The clock distribution system as recited in claim 2, wherein the master clock gating circuit is further configured to decrease current flow between the pre-buffered clock node and the first power reference in response to the delay control signal.

4. The clock distribution system as recited in claim 1, wherein said earlier stage clock signal is the slave clock signal generated by the slave clock gating circuit.

5. The clock distribution system as recited in claim 1, wherein said delay increases a hold time of said flip-flop circuit within a predetermined time margin.

6. The clock distribution system as recited in claim 1, wherein said master clock gating circuit and said slave clock gating circuit each are further configured to convey a corresponding clock signal with no transitions in response to receiving a power down signal.

7. A clock distribution method comprising:
   generating a master clock signal from a different earlier stage clock signal;
   generating a slave clock signal based;
   selecting a delay based on a delay control signal utilizing a pre-existing scan register for selecting the delay with the delay control signal, wherein the delay determines an additional amount of time the master clock signal transitions after a slave clock signal transitions;
   providing the slave clock signal to a slave clock input of a flip-flop circuit;
   providing the master clock signal to a master clock input of the flip-flop circuit; and
   conveying the master clock signal and the slave clock signal to a plurality of flip-flop circuits.

8. The clock distribution method as recited in claim 7, further comprising conveying the delay control signal and the earlier stage clock signal to a master clock gating circuit, wherein the master clock gating circuit comprises:
   a first transistor having a first drain terminal coupled to a pre-buffered clock node, a first gate terminal coupled to receive an earlier stage clock signal, and a first source terminal coupled to an intermediate node;
   a second transistor having a second drain terminal coupled to the intermediate node, a second gate terminal coupled to receive a delay control signal, and a source terminal coupled to a first power reference; and
   a third transistor having a third drain terminal coupled to the intermediate node, a third gate terminal coupled to a second power reference opposite in logic value of the first power reference, and a third source terminal coupled to the first power reference.

9. The clock distribution method as recited in claim 8, further comprising decreasing current flow between the pre-buffered clock node and the first power reference in response to the delay control signal.

10. The clock distribution method as recited in claim 7, wherein said earlier stage clock signal is the slave clock signal generated by the slave clock gating circuit.

11. The clock distribution method as recited in claim 7, further comprising increasing a hold time of said flip-flop circuit within a predetermined time margin.

12. The clock distribution method as recited in claim 7, further comprising conveying the master clock signal and the slave clock signal with no transitions in response to receiving a power down signal.

13. A master clock gating circuit comprising:
   a clock input line for receiving an earlier stage clock signal;
   a delay control line for receiving a delay control signal; and
   circuitry configured to:
      generate a master clock signal from the earlier stage clock signal;
      select a delay based on the delay control signal, wherein the delay determines an additional amount of time the master clock signal transitions after a slave clock signal transitions, wherein selecting the delay with the delay control signal is performed with the use of a pre-existing scan register; and
      convey the master clock signal to a master clock input, different from a slave clock input, of a flip-flop circuit; and
      convey a master clock signal to a plurality of flip-flop circuits.

14. The clock gating circuit as recited in claim 13, wherein the circuitry comprises:
   a first transistor having a first drain terminal coupled to a pre-buffered clock node, a first gate terminal coupled to receive an earlier stage clock signal, and a first source terminal coupled to an intermediate node;
   a second transistor having a second drain terminal coupled to the intermediate node, a second gate terminal coupled to receive said delay control signal, and a source terminal coupled to a first power reference; and
   a third transistor having a third drain terminal coupled to the intermediate node, a third gate terminal coupled to a second power reference opposite in logic value of the first power reference, and a third source terminal coupled to the first power reference.

* * * * *